(12) United States Patent
Oishi et al.

(10) Patent No.: US 8,432,213 B2
(45) Date of Patent: Apr. 30, 2013

(54) WAVE DETECTOR CIRCUIT AND HIGH-FREQUENCY CIRCUIT

(75) Inventors: Shingo Oishi, Osaka (JP); Toshiya Tsukao, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 339 days.

(21) Appl. No.: 12/894,245

(22) Filed: Sep. 30, 2010

(65) Prior Publication Data

US 2011/0110135 A1    May 12, 2011

(30) Foreign Application Priority Data

Nov. 10, 2009    (JP) ................. 2009-256975

(51) Int. Cl.
*H03K 17/60*    (2006.01)
*H02M 7/06*    (2006.01)

(52) U.S. Cl.
USPC .......................................... 327/478; 363/126

(58) Field of Classification Search .............. 363/84, 363/89, 125, 126, 127; 327/77, 80–83, 478, 327/512, 513
See application file for complete search history.

(56) References Cited

U.S. PATENT DOCUMENTS

| 5,196,806 A | 3/1993 | Ichihara |
| 6,262,630 B1 | 7/2001 | Eriksson |
| 7,209,842 B2 * | 4/2007 | Mizuno et al. .............. 702/64 |
| 7,253,681 B2 * | 8/2007 | Ichitsubo et al. ........... 330/140 |
| 2003/0234675 A1 | 12/2003 | Tamura et al. |
| 2008/0174356 A1 | 7/2008 | Yamamoto et al. |
| 2012/0081027 A1 * | 4/2012 | Anissimov ................. 315/291 |

FOREIGN PATENT DOCUMENTS

| CN | 1367951 A | 9/2002 |
| CN | 201146482 Y | 11/2008 |
| JP | 4-348605 A | 12/1992 |
| JP | 5-22159 A | 1/1993 |
| JP | 2000-196473 A | 7/2000 |
| JP | 2004-23707 A | 1/2004 |
| JP | 2006-166401 A | 6/2006 |
| JP | 2007-300262 A | 11/2007 |
| JP | 2008-148214 A | 6/2008 |
| JP | 2009-141589 A | 6/2009 |

* cited by examiner

*Primary Examiner* — Matthew Nguyen
(74) *Attorney, Agent, or Firm* — Birch, Stewart, Kolasch & Birch, LLP

(57) ABSTRACT

The temperature dependence of detection characteristics in a wave detector circuit is suppressed. A bias resistor and/or a load resistor are/is constituted by a resistive element having a high temperature coefficient, whereby a shift in detected output along with a change in temperature of a wave detector diode included in a diode detector circuit is canceled by a shift in detected output along with a change in temperature of the bias resistor and/or a shift in detected output along with a change in temperature of the load resistor.

9 Claims, 7 Drawing Sheets

WAVE DETECTOR CIRCUIT AND HIGH-FREQUENCY CIRCUIT

This Nonprovisional application claims priority under 35 U.S.C. §119(a) on Patent Application No. 2009-256975 filed in Japan on Nov. 10, 2009, the entire contents of which are hereby incorporated by reference.

TECHNICAL FIELD

The present invention relates to a wave detector circuit that generates a direct-current voltage corresponding to the strength of an alternating-current signal. Further, the present invention relates to a high-frequency circuit including such a wave detector circuit.

BACKGROUND ART

A transmitter power amplifier that is mounted in a wireless communication device is often used concomitantly with a wave detector circuit that generates a direct-current voltage corresponding the strength of an output signal (high-frequency signals) of the transmitter power amplifier, with the intention to optimize transmission power (power consumption control or spurious control) by adjusting, in accordance with a detected output (a direct-current voltage generated in the wave detector circuit being hereinafter referred to as "detected output"), the level of a transmitter signal that is inputted to the transmitter power amplifier. In particular, power amplifier ICs having amplifier circuits and wave detector circuits integrated thereinto are often mounted in small-size wireless communication devices such as wireless LAN terminals or WiMAX terminals.

Examples of such a transmitter power amplifier can be found in Patent Literatures 1 and 2, which disclose power amplifiers each including: a power amplifier circuit including a power-amplifying transistor; and a wave detector circuit including a wave detector diode having its anode terminal connected to a collector terminal of the power-amplifying transistor via a capacitor.

The power amplifier of Patent Literature 1 is provided with a current-amplifying transistor for supplying a bias current to a base terminal of the power-amplifying transistor and to the anode terminal of the wave detector diode, whereby a reduction in the amount of power that is used in the wave detector circuit and a reduction in noise that is caused by a crosstalk signal coming from the wave detector circuit are achieved.

Further, the power amplifier (semiconductor integrated circuit) of Patent Literature 2 is provided with a biasing transistor (referred to also as "emitter-follower transistor") connected to the anode terminal of the wave detector diode, whereby an expansion in detection amplitude is achieved.

CITATION LIST

Patent Literature 1

Japanese Patent Application Publication, Tokukai, No. 2007-300262 (Publication Date: Nov. 15, 2007)

Patent Literature 2

Japanese Patent Application Publication, Tokukai, No. 2009-141589 (Publication Date: Jun. 25, 2009)

SUMMARY OF INVENTION

Technical Problem

However, such a conventional power amplifier using a wave detector diode to generate a direct-current voltage corresponding to the strength of a high-frequency signal has suffered from temperature-dependent variations in detection characteristic due to the temperature dependence of the on-voltage of the wave detector diode.

Further, in the case of adoption of such a conventional configuration as the power amplifiers of Patent Literatures 1 and 2 in which an input terminal of the wave detector circuit (the anode terminal of the wave detector diode) is connected to an output terminal of the power-amplifying circuit (the collector terminal of the power-amplifying transistor), the detected output is affected by the characteristic impedance of an apparatus connected to the output terminal of the power-amplifying circuit. An example of an apparatus that is connected to the output terminal of the power-amplifying circuit constituting the transmitter power amplifier is an antenna. It is well known that the characteristic impedance of an antenna varies greatly according to circumstances.

This makes it conceivable to: compose the power-amplifying circuit of multiple stages; cause the wave detector circuit to receive an input signal that is inputted to the final stage, i.e., an output signal that is outputted from the driver stage, instead of receiving an output signal that is outputted from the final stage; and thereby make the detected output less likely to be affected by the characteristic impedance of an apparatus connected to the output terminal of the power-amplifying circuit. In fact, a transmitter power amplifier that is mounted in a wireless communication device is often composed of a double- or triple-stage amplifying transistors to have a gain of approximately 25 dBm to 30 dBm, and the adoption of a configuration in which an output signal that is outputted from the driver stage is inputted into the wave detector circuit makes it possible to prevent the detected output from being affected by the characteristic impedance of an antenna. However, the adoption of such a configuration results in a build-up of a shift in detected output due to the temperature dependence of the gain of the driver stage on a shift in detected output due to the temperature dependence of the on-voltage of the wave detector diode, and this build-up leads to a further increase in temperature dependence of the detection characteristics.

Patent Literature 2 states that the temperature dependence of detection characteristics can be reduced by connecting a serial connection of a biasing transistor (a transistor different from the transistor referred to as "emitter-follower transistor" in Patent Literature 2) and a biasing diode in parallel with a serial connection of the biasing transistor (transistor referred to as "emitter-follower transistor") and the wave detector diode and thereby forming these elements on a semiconductor substrate in one manufacturing process. However, in the case of such a build-up of a shift in detected output due to the temperature dependence of the gain of the driver stage on a shift in detected output due to the temperature dependence of the on-voltage of the wave detector diode, the method of Patent Literature 2 cannot realize temperature compensating by canceling the shifts in detected output.

The present invention has been made in view of the foregoing problems, and it is an object of the present invention to control the temperature dependence of detection characteristics in a wave detector circuit more easily and more effectively than ever before.

Solution to Problem

In order to solve the foregoing problem, a wave detector circuit according to the present invention includes: a diode detector circuit, including a diode connected to a power supply via a bias resistor, which uses the diode to generate a direct-current voltage corresponding to a strength of an alternating-current signal; and a transistor amplifier circuit, including a transistor connected to a power supply via a load resistor, which uses the transistor to amplify the direct-current voltage generated by the diode detector circuit, a sum of an amount of change in output voltage of the transistor amplifier circuit along with a change in temperature of the bias resistor and an amount of change in output voltage of the transistor amplifier circuit along with a change in temperature of the load resistor having a temperature range equal to or larger than an amount of change in output voltage of the transistor amplifier circuit along with a change in temperature of the diode.

According to the foregoing configuration, the amount of change in output voltage of the transistor amplifier circuit along with a change in temperature of the diode can be canceled by the amount of change in output voltage of the transistor amplifier circuit along with a change in temperature of the bias resistor and the amount of change in output voltage of the transistor amplifier circuit along with a change in temperature of the load resistor. Therefore, the mere constitution of the bias resistor and the load resistor by a resistive element having a high temperature coefficient brings about an effect of making it possible to suppress the temperature dependence of a detected output more easily and more effectively than ever before.

Advantageous Effects of Invention

A wave detector circuit according to the present invention can cancel the amount of change in output voltage of an amplifier circuit along with a change in a diode because the sum of the amount of change in output voltage of the transistor amplifier circuit along with a change in temperature of a bias resistor and the amount of change in output voltage of the transistor amplifier circuit along with a change in temperature of a load resistor having a temperature range equal to or larger than the amount of change in output voltage of the transistor amplifier circuit along with a change in temperature of the diode. Therefore, the mere constitution of the bias resistor and the load resistor by a resistive element having a high temperature coefficient brings about an effect of making it possible to suppress the temperature dependence of a detected output more easily and more effectively than ever before.

DESCRIPTION OF EMBODIMENTS

Figure 1:
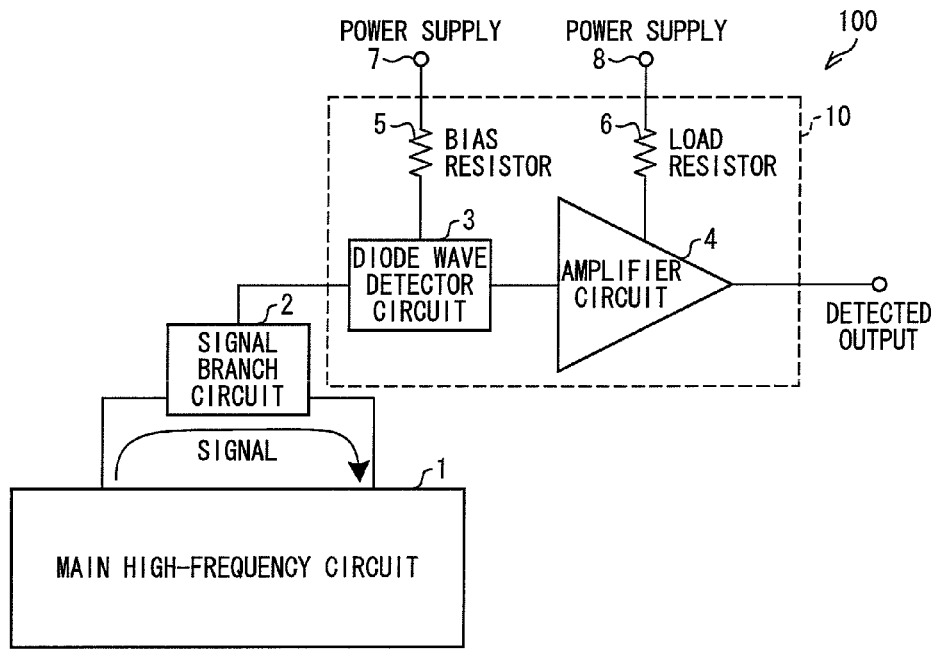
FIG. 1 is a block diagram showing the configuration of a high-frequency circuit including a wave detector circuit according to the present invention.

The configuration of a wave detector circuit 10 according to the present embodiment is described below with reference to FIG. 1. FIG. 1 is a block diagram showing the configuration of a high-frequency circuit 100 including a wave detector circuit 10 according to the present embodiment.

As shown in FIG. 1, the high-frequency circuit 100 includes: a main high-frequency circuit 1; a signal branch circuit 2 for taking out part of a high-frequency signal (alternating-current signal) that is transmitted through a signal-flow path of the high-frequency circuit 1; a diode detector circuit 3 for generating a direct-current voltage corresponding to the strength of the high-frequency signal taken out by the signal branch circuit 2; and an amplifier circuit 4 for amplifying the direct-current voltage generated by the diode detector circuit 3. The wave detector circuit 10 according to the present embodiment is constituted by the diode detector circuit 3 and the amplifier circuit 4.

The diode detector circuit 3 includes a wave detector diode (not shown) having its anode terminal connected, as shown in FIG. 1, to a power supply 7 via a bias resistor 5, and applied to this wave detector diode is a forward bias obtained by subtracting a fall in voltage in the bias resistor 5 from the voltage of the power supply 7. That is, this wave detector diode has its operating point defined by the voltage of the power supply 7 and the resistance of the bias resistor 5. It should be noted that the term "on-voltage of the wave detector diode" refers to a voltage at which a forward current rises, and corresponds to a fall in forward voltage during the flow of a forward current.

Further, the amplifier circuit 4 includes a bipolar transistor (not shown) having its collector terminal connected, as shown in FIG. 1, to a power supply 8 via a load resistor 6, and applied to the collector terminal of this bipolar transistor is a voltage obtained by subtracting a fall in voltage in the load resistor 6 from the voltage of the power supply 8. That is, this bipolar transistor has its operating point defined by the voltage of the power supply 8 and the load resistor 6.

The on-voltage of the wave detector diode included in the diode detector circuit 3 has negative temperature characteristics. Therefore, if the forward bias is constant, a rise in temperature causes the detected output to shift toward a greater value and a drop in temperature causes the detected output to shift toward a lower value. On the other hand, the bias resistor 5 has positive temperature characteristics. For this reason, a rise in temperature causes the bias voltage applied to the wave detector diode to decrease to cause the detected output to shift toward a lower value, and a drop in temperature causes the bias voltage applied to the wave detector diode to increase to cause the detected output to shift toward a greater value. Therefore, if the bias resistor 5 and the wave detector diode are thermally coupled, the shift in detected output along with a change in temperature of the bias resistor 5 acts in such a way as to cancel the shift in detected output along with a change in temperature of the wave detector diode.

However, the convention semiconductor processes use metal thin-film resistors having temperature coefficients of 100 ppm/° C. or lower. Therefore, when the bias resistor 5 is constituted by a metal thin-film resistor, the amount of shift in forward bias along with a change in temperature of the bias resistor 5 falls short of the amount of shift in on-voltage along with a change in temperature of the wave detector diode, with the result that the shift in detected output along with a change in temperature of the wave detector diode cannot be canceled by the shift in detected output along with a change in temperature of the bias resistor 5.

Figure 2:
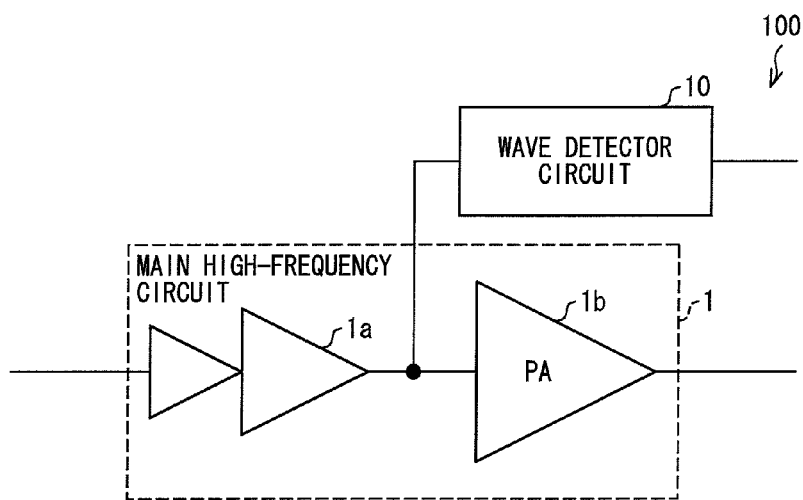
FIG. 2 is a block diagram showing the configuration of a main high-frequency circuit included in the high-frequency circuit of FIG. 1.

In particular, in the case of configuring the main high-frequency circuit 1 as shown in FIG. 2 to multistage-amplify a high-frequency signal through a driver stage 1a and a power stage (final stage) 1b and causing the diode detector circuit 3 to receive an output signal from the driver stage 1a, it becomes necessary to cancel a shift in detected output along with a change in temperature of the driver stage 1a (usually, a transistor that constitutes a driver stage has a positive temperature coefficient), in addition to the shift in detected output along with a change in temperature of the wave detector diode. Such a cancellation cannot be realized by the bias resistor 5 constituted by a metal thin-film resistor.

Accordingly, in the wave detector circuit 10 according to the present embodiment, the bias resistor 5 is constituted by a resistive element having a sufficiently high positive temperature coefficient, whereby the amount of shift in detected output along with a change in temperature of the bias resistor 5 is equal to or larger than the amount of shift in detected output along with a change in temperature of the wave detector diode. More specifically, the bias resistor 5 is constituted by a resistive element having a temperature coefficient of 500 ppm/° C., whereby the amount of shift in detected output along with a change in temperature of the bias resistor 5 is equal to or larger than the amount of shift in detected output along with a change in temperature of the wave detector diode.

Although such a configuration has been described here in which the shift in detected output along with a change in temperature of the wave detector diode is canceled by the shift in detected output along with a change in temperature of the bias resistor 5, the present invention is not limited to this. That is, such a configuration may be adopted in which the shift in detected output along with a change in temperature of the wave detector diode is canceled by a shift in detected output along with a change in temperature of the load resistor 6. Alternatively, such a configuration may be adopted in which the shift in detected output along with a change in temperature of the wave detector diode is canceled by both the shift in detected output along with a change in temperature of the bias resistor 5 and the shift in detected output along with a change in temperature of the load resistor 6. That is, the present invention can be carried out by selecting at least either the resistive element constituting the bias resistor 5 or the resistive element constituting the load resistor 6 so that the sum of the amount of shift in detected output along with a change in temperature of the bias resistor 5 and the amount of shift in detected output along with a change in temperature of the load resistor 6 exceeds the amount of shift in detected output along with a change in temperature of the wave detector diode.

A reason for the feasibility of such a configuration is as follows: Since the load resistor 6 also has a negative temperature coefficient, a rise in temperature causes the collector potential of the bipolar transistor included in the amplifier circuit 4 to decrease to cause the detected output to shift toward a lower value, and a drop in temperature causes the collector potential of the bipolar transistor included in the amplifier circuit 4 to increase to cause the detected output to shift toward a greater value. Therefore, if the load resistor 6 is constituted by a resistive element having a high temperature coefficient, the same effect will be brought about as if the bias resistor 5 were constituted by a resistive element having a high temperature coefficient. In particular, if both the bias resistor 5 and the load resistor 6 are constituted by resistive elements having high temperature coefficients, it will be easy to cancel a shift in detected output along with a change in temperature of the driver stage 1a, in addition to the shift in detected output along with a change in temperature of the wave detector diode, even in the case of configuring the main high-frequency circuit 1 as shown in FIG. 2 to multistage-amplify a high-frequency signal through a driver stage 1a and a power stage (final stage) 1b and causing the diode detector circuit 3 to receive an output signal from the driver stage 1a.

EXAMPLE CONFIGURATION 1

Figure 3:
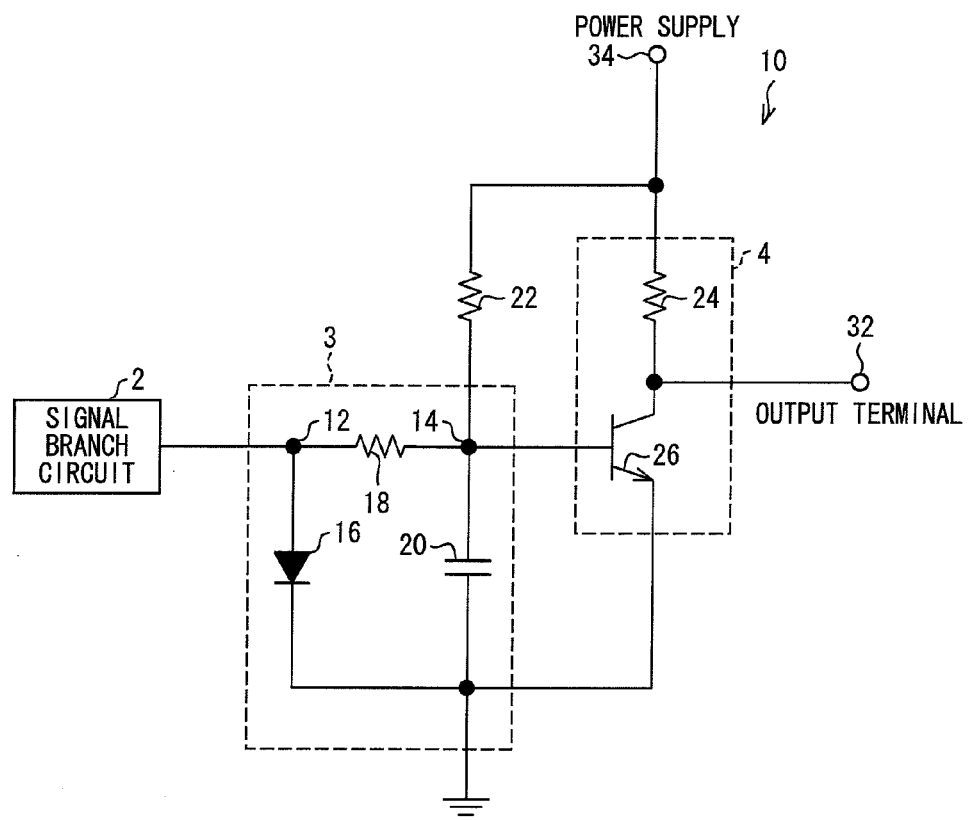
FIG. 3 is a circuit diagram showing a first example configuration of the wave detector circuit of FIG. 1.

Next, a more specific example configuration of the wave detector circuit 10 is described with reference to FIG. 3. FIG. 3 is a circuit diagram showing a first example configuration of the wave detector circuit 10.

The diode detector circuit 3 of FIG. 3 is configured to include (i) a wave detector diode 16 having its anode terminal connected to an input point 12 and its cathode terminal grounded, (ii) a bias resistor 18 (which corresponds to the bias resistor 5 of FIG. 1) having one terminal connected to the input point 12 and the other terminal connected to an output point 14, and (iii) a capacitor 20 having one terminal connected to the output point 14 and the other terminal grounded, and to output via the output point 14 a direct-current voltage corresponding to the strength of a high-frequency signal inputted via the input point 12. The diode detector circuit 3 has its output point 14 connected to a power supply 34 via a resistor 22, and a voltage obtained by subtracting falls in voltage in the resistor 22 and the bias resistor 18 from the voltage of the power supply 34 is applied as a forward bias to the wave detector diode 16. For this reason, the direct-current voltage corresponding to the strength of a high-frequency signal can be obtained even when the high-frequency signal has a voltage value lower than the on-voltage of the wave detector diode 16 (which is normally 1.2 V or lower).

A high-frequency signal taken out by the signal branch circuit 2 is inputted into the diode detector circuit 3 via the input point 12. During a period when the high-frequency signal has a positive voltage value (more precisely, during a period when the voltage applied to the wave detector diode 16 is equal to or higher than the on-voltage), the wave detector diode 16 becomes conductive, so that the potential of the input point 12 is clamped close to the ground potential. On the other hand, during a period when the high-frequency signal has a negative voltage value (more precisely, during a period when the voltage applied to the wave detector diode 16 is equal to or lower than the on-voltage), the wave detector diode 16 becomes disconnected, so that the potential of the input point 12 becomes substantially equal to the voltage value of the high-frequency signal. The high-frequency signal thus rectified by the wave detector diode 16 is smoothed by a low-pass filter constituted by the bias resistor 18 and the capacitor 20. This allows the potential of the output point 14 to take on a value corresponding to the strength of the high-frequency signal.

Further, the amplifier circuit 4 of FIG. 3 is configured to include a bipolar transistor 26 having its collector terminal connected to the power supply 34 via a load resistor 24 (which corresponds to the load resistor 6 of FIG. 1), its base terminal connected to the output point 14 of the diode detector circuit 3, and its emitter terminal ground, and to amplify a direct-current voltage that is outputted from the output point 14 of the diode detector circuit 3. Since the bipolar transistor 26 has its collector terminal connected to the power supply 34 via the load resistor 24, a voltage obtained by subtracting a fall in voltage in the load resistor 24 from the voltage of the power supply 34 is applied to the collector terminal of the bipolar transistor 26. The direct-current voltage (i.e., the detected output) amplified by the amplifier circuit 4 is outputted via an output terminal 32.

It should be noted here that the bias resistor 18 and the load resistor 24 are each constituted by a resistive element having a temperature coefficient of 500 ppm/° C. of more, and that the wave detector diode 16, the bias resistor 18, and the load resistor 24 are disposed closed to each other in such a way as to be thermally coupled to each other. Thus, a shift in detected output along with a change in temperature of the wave detector diode 16 can be canceled by both a shift in detected output along with a change in temperature of the bias resistor 18 and a shift in detected output along with a change in temperature of the load resistor 24.

EXAMPLE CONFIGURATION 2

Figure 4:
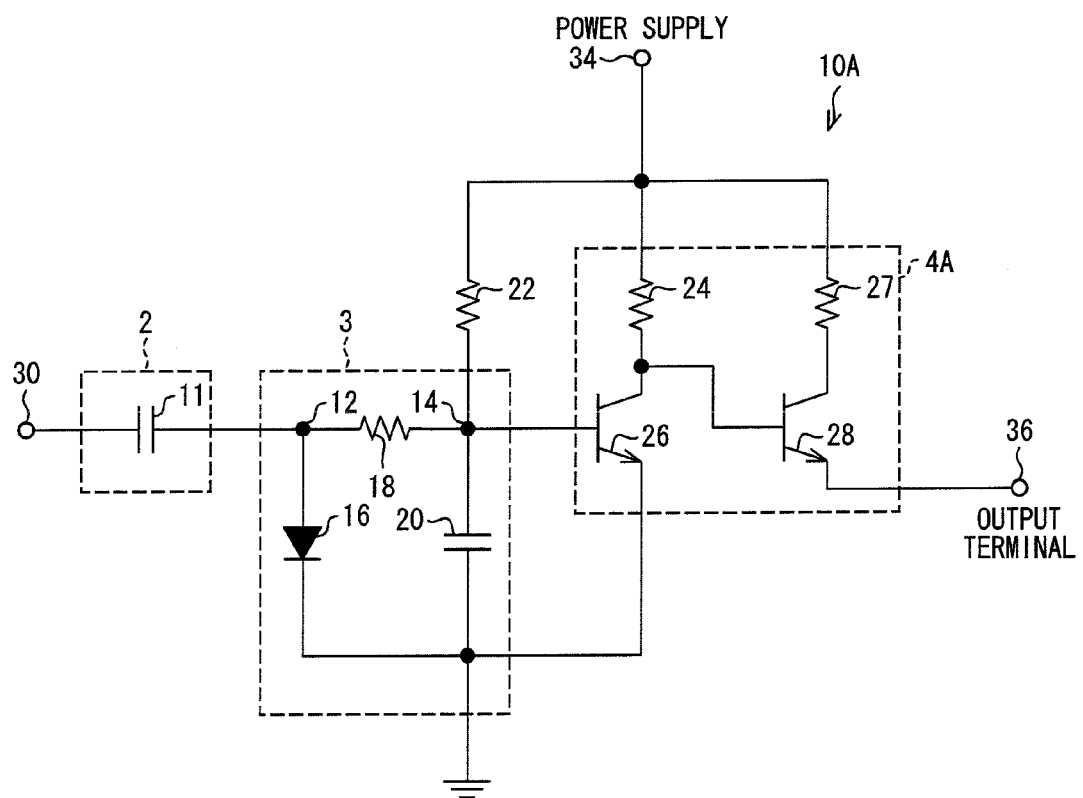
FIG. 4 is a circuit diagram showing a second example configuration of the wave detector circuit of FIG. 1.

Next, a second example configuration of the wave detector circuit 10 is described with reference to FIG. 4. FIG. 4 is a circuit diagram showing a second example configuration of the wave detector circuit 10 (wave detector circuit 10A).

A diode detector circuit 3 of FIG. 4 is identical in configuration to the diode detector circuit 3 of FIG. 3. On the other hand, an amplifier circuit 4A of FIG. 4 is configured by adding an emitter follower to such an amplifier circuit 4 as shown in FIG. 3. More specifically, the amplifier circuit 4A of FIG. 4 is configured to include (i) a first bipolar transistor 26 having its collector terminal connected to a power supply 34 via a load resistor 24, its base terminal connected to an output point 14 of the diode detector circuit 3, and its emitted terminal grounded and (ii) a second bipolar transistor 28 having its collector terminal connected to the power supply 34 via a load resistor 27, its base terminal connected to the collector terminal of the first bipolar transistor 26, and its emitter terminal connected to an output terminal 36, such that the direct-current voltage (i.e., the detected output) amplified by the amplifier circuit 4 is outputted via the output terminal 36 connected to the emitter terminal of the second bipolar transistor 28. Further, this example configuration has a signal branch circuit 2 constituted by a capacitor 11.

It should be noted that those circuits which constitute the wave detector circuit 10A of FIG. 4 can be formed on a single substrate, for example, by a InGaAs/GaAs HBT (heterojunction bipolar transistor) process. The wave detector diode 16, which constitutes the wave detector circuit 3, can be realized by the same npn structure as the (hetero-junction) bipolar transistors 26 and 28, which constitute the amplifier circuit 4A. More specifically, the wave detector diode 16 can be realized by coupling an emitter layer and a base layer in the npn structure or coupling a collector layer and the base layer in the npn structure. Further, the capacitor 20 can be realized as an MIM (metal insulator metal) capacitor in which two layers of wiring electrode and an interlayer insulating film are used.

In the case of formation of a detection path on a single substrate by the InGaAs/GaAs HBT process, metal resistors are used as the resistors because of their high accuracy of formation. General examples of metal resistors are resistors composed of NiCr and resistors composed of TaN with a temperature coefficient of 100 ppm/° C. or lower. Also in the wave detector circuit 10A of FIG. 4, the resistor 22 and the load resistor 27 are TaN thin-film resistors. Meanwhile, for consistency with the InGaAs/GaAs HBT process, the bias resistor 18 and the load resistor 24 are base-layer resistors formed on the base layer, whose temperature coefficient is 2000 ppm/° C. or lower. Further, in the process used, the base layer has a sheet resistance of 200 Ω or lower.

Figure 7:
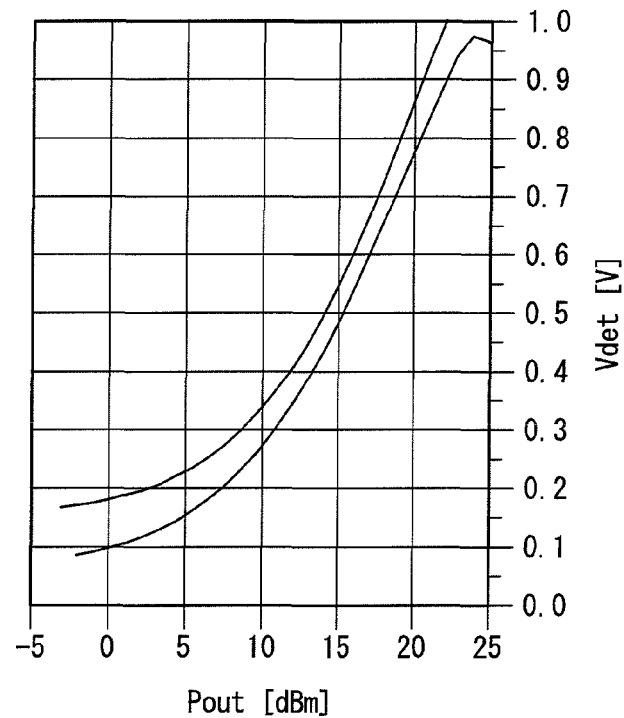
FIG. 7 is a graph showing the detection characteristics of the wave detector circuit of FIG. 4 whose bias resistor and load resistor are TaN thin-film resistors.
Figure 8:
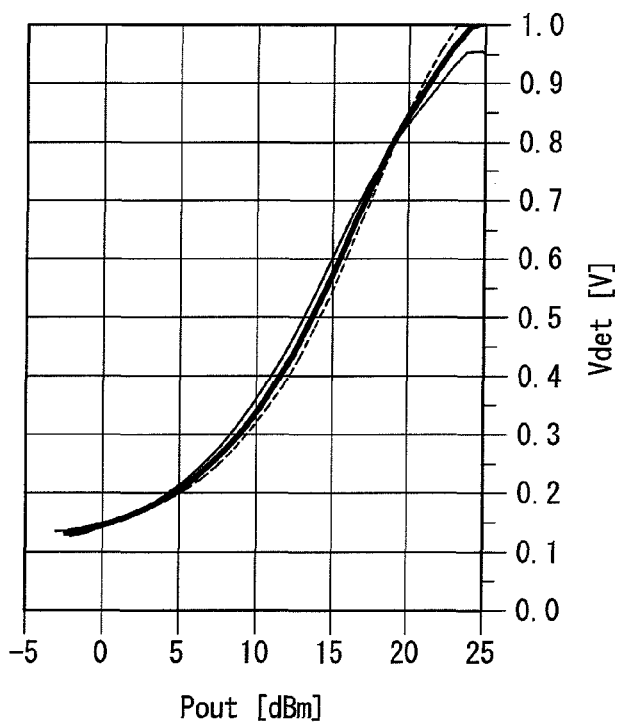
FIG. 8 is a graph showing the detection characteristics of the wave detector circuit of FIG. 4 whose bias resistor and load resistor are base-layer resistors.

FIGS. 7 and 8 shows the results of evaluations as obtained when such wave detector circuits 10A as shown in FIG. 4 were fabricated according to the HBT process. FIG. 7 is a graph showing detection characteristics obtained when the bias resistor 18 and the load resistor 24 are TaN thin-film resistors, and FIG. 8 is graph showing detection characteristics obtained when the bias resistor 18 and the load resistor 24 are base-layer resistors. In each of the graphs, the horizontal axis Pout represents the strength of a high-frequency signal that is outputted from the main high-frequency circuit 1, which is a main circuit, and the vertical axis Vdet represents a detected output that is outputted from the wave detector circuit 10A. Further, in FIG. 7, the upper solid line represents a detection characteristic obtained when the wave detector circuit 10A is at 85° C., and the lower solid line represents a detection characteristic obtained when the wave detector circuit 10A is at −40° C. In FIG. 8, the solid line, the dotted line, and the heavy line represent a detection characteristic obtained when the wave detector circuit 10A is at −40° C., a detection characteristic obtained when the wave detector circuit 10A is at 85° C., and a detection characteristic obtained when the wave detector circuit 10A is at 25° C., respectively.

Reference to the graph of FIG. 7 shows that when the bias resistor 18 and the load resistor 24 are TaN thin-film transistors, the detected output differ by a maximum of approximately 0.1 V between 85° C. and −40° C. Meanwhile, reference to the graph of FIG. 8 shows that when the bias resistor 18 and the load resistor 24 are base-layer resistors, the temperature dependence of the detected output can be suppressed well over a strength range of 0 dBm to 20 dBm of the high-frequency signal that is outputted from the main high-frequency circuit 1.

Although in the description above the base-layer resistors are used as resistors having high temperature coefficients, the collector-layer resistors may be used instead, because the collector layer has about the same temperature coefficient as the base-layer resistors, albeit low in sheet resistance and therefore unsuitable for high resistance. Further, FIGS. 7 and 8 show the effect of a wave detector circuit fabricated according the InGaAs/GaAs HBT process, the same effect can also be produced by a wave detector circuit fabricated according to another process. For example, the same effect can also be obtained when a wave detector circuit 10 is fabricated according to a semiconductor device process based on a GaAs or Si wafer.

Figure 9:
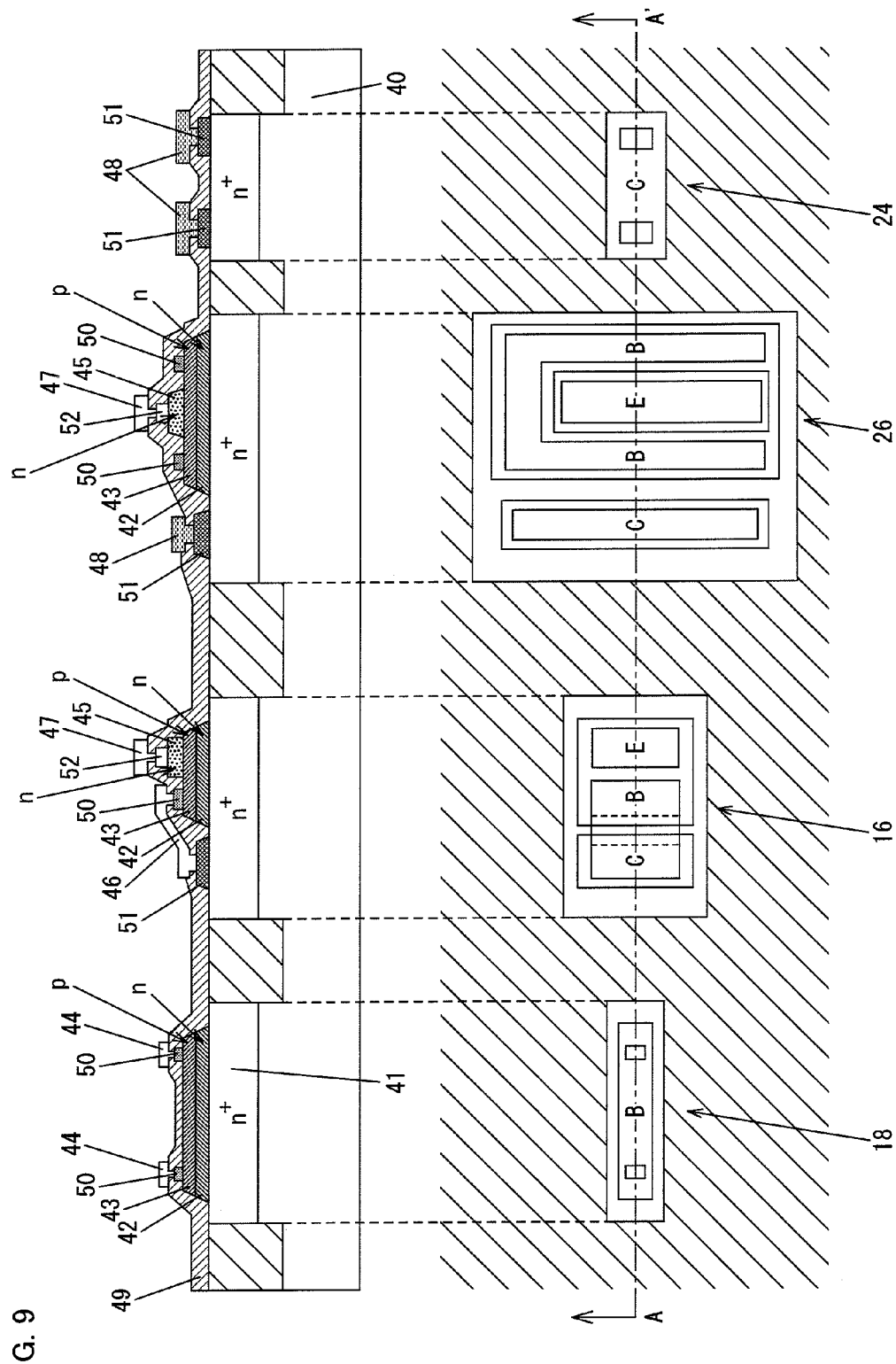
FIG. 9 shows top and cross-sectional views of a transistor constituted by an npn structure, a diode constituted by an npn structure, a base-layer resistor, and a collector-layer resistor as formed on a single substrate in the wave detector circuit of FIG. 4.

FIG. 9 here shows top and cross-sectional views of a bipolar transistor 26 constituted by an npn structure, a wave detector diode 16 constituted by an npn structure, a bias resistor 18, and a load resistor 24 as formed on a single substrate. FIG. 9 shows top and cross-sectional views of a transistor constituted by an npn structure, a diode constituted by an npn structure, a base-layer resistor, and a collector-layer resistor as formed on a single substrate.

Although FIG. 9 shows an example where the bias resistor 18 is constituted by a base-layer resistor and the load resistor 24 is constituted by a collector-layer resistor, the bias resistor 18 and the load resistor 24 may both be constituted by base-layer resistors or constituted by collector-layer resistors. Further, the bias resistor 18 may be constituted by a collector-layer resistor, and the load resistor 24 may be constituted by a base-layer resistor. It should be noted that the bipolar transistor 28 of FIG. 4 may be identical in configuration to the bipolar transistor 26 and therefore is not shown in FIG. 9.

As shown in the top view and the cross-sectional view taken along the line A-A' of FIG. 9, a sub-collector layer 41 is on an SI substrate 40. As shown in FIG. 9, the bias resistor 18 is configured such that a collector layer 42 is on the sub-collector layer 41, that a base layer 43 is on the collector layer 42, and that base electrode 44 are on two base contact electrodes 50 formed on the base layer 43.

The wave detector diode 16 is configured such that the collector layer 42 and a collector contact electrode 51 are on the sub-collector layer 41 and that the base layer 43 is on the collector layer 42. Further, the wave detector diode 16 has its base contact electrode 50 and its emitter layer 45 formed on the base layer 43, and the base contact electrode 50 is coupled to the collector contact electrode 51 via a coupling electrode 46. Furthermore, the wave detector diode 16 is configured such that an emitter contact electrode 52 is on the emitter layer 45 and that an emitter electrode 47 is on the emitter contact electrode 52.

The bipolar transistor 26 is configured such that the collector layer 42 and a collector contact electrode 51 are on the sub-collector layer 41, that a collector electrode 48 is on the collector contact electrode 51, and that the base layer 43 is on the collector layer 42. Further, the bipolar transistor 26 is configured such that the emitter layer 45 and a base contact electrode 50 are on the base layer 43, that an emitter contact electrode 52 is on the emitter layer 45, and an emitter electrode 47 is on the emitter contact electrode 52. It should be noted that the base contact electrode 50 is in such a U shape as to surround the emitter layer 45.

The load resistor 24 is configured such that two collector contact electrodes 51 are on the sub-collector layer 41 and that collector electrodes 48 are on the two collector contact electrodes 51.

Further, as shown in FIG. 9, the bias resistor 18, the wave detector diode 16, the bipolar transistor 26, and the load resistor 24 are insulated from each other by an insulator 49.

Although the present embodiment shows, but is not limited to, a configuration in which the bipolar transistor 26 and 28 and the wave detector diode 16 are constituted by npn structures. For example, it is possible to adopt a configuration in which the bipolar transistor 26 and 28 and the wave detector diode 16 are constituted by pnp structures.

EXAMPLE CONFIGURATION 3

Figure 5:
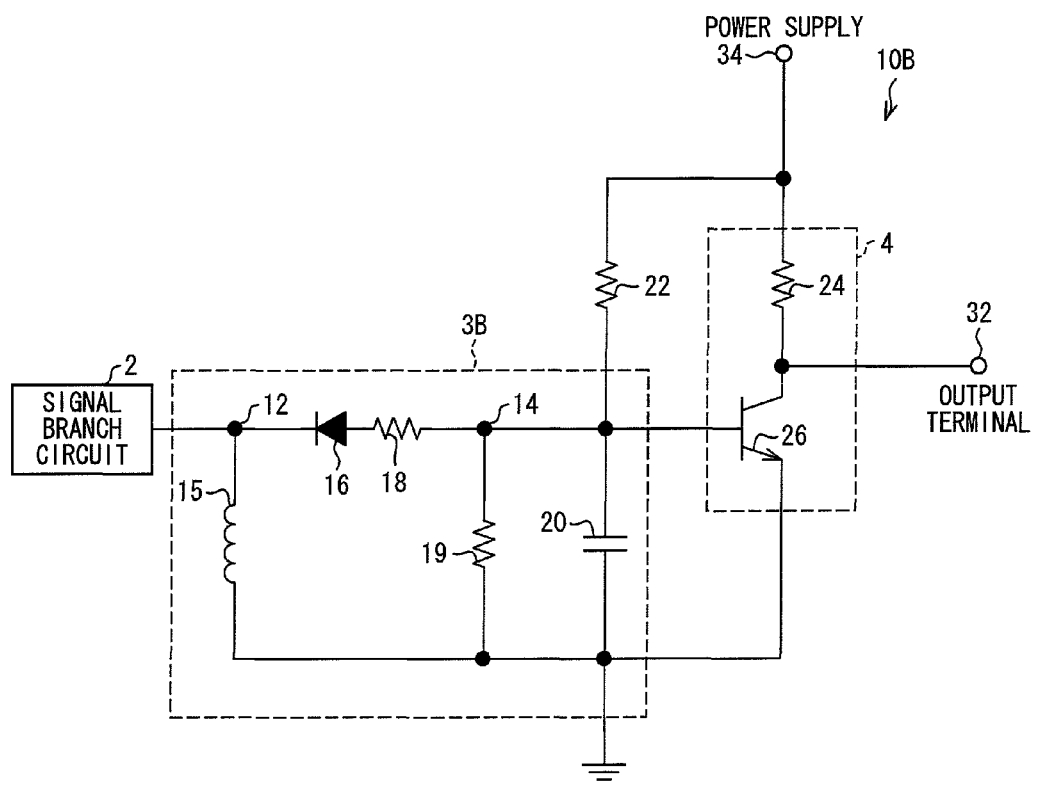
FIG. 5 is a circuit diagram showing a third example configuration of the wave detector circuit of FIG. 1.

Next, a third example configuration of the wave detector circuit 10 is described with reference to FIG. 5. FIG. 5 is a circuit diagram showing a third example configuration of the wave detector circuit 10 (wave detector circuit 10B).

In the wave detector circuit 10B of FIG. 5, the diode detector circuit 3B is configured to include (i) a wave detector diode 16 having its cathode terminal connected to an input point 12 and its anode terminal connected to an output point 14 via a bias resistor 18 (which corresponds to the bias resistor 5 of FIG. 1), (ii) an inductor 15 having one terminal connected to the input point 12 and the other terminal grounded, (iii) a resistor 19 having one terminal connected to the output point 14 and the other terminal grounded, and (iv) a capacitor 20 having one terminal connected to the output point 14 and the other terminal grounded, and to output via the output point 14 a signal wave contained in a high-frequency signal that is inputted via the input point 12. The diode detector circuit 3B has its output point 14 connected to a power supply 34 via a resistor 22, and a voltage obtained by subtracting falls in voltage in the resistor 22 and the bias resistor 18 from the voltage of the power supply 34 is applied as a forward bias to the wave detector diode 16. Meanwhile, the amplifier circuit 4 of FIG. 5 is identical in configuration to the amplifier circuit 4 of FIG. 4. A direct-current voltage generated by the diode detector circuit 3B is inverted and amplified by the amplifier circuit 4 and then outputted via an output terminal 32.

Also in this specific example, the bias resistor 18 and the load resistor 24 are each constituted by a resistive element having a temperature coefficient of 500 ppm/° C. or higher, and the wave detector diode 16, the bias resistor 18, and the load resistor 24 are disposed closed to each other in such a way as to be thermally coupled to each other. Thus, a shift in detected output along with a change in temperature of the wave detector diode 16 can be canceled by both a shift in detected output along with a change in temperature of the bias resistor 18 and a shift in detected output along with a change in temperature of the load resistor 24.

EXAMPLE CONFIGURATION 4

Figure 6:
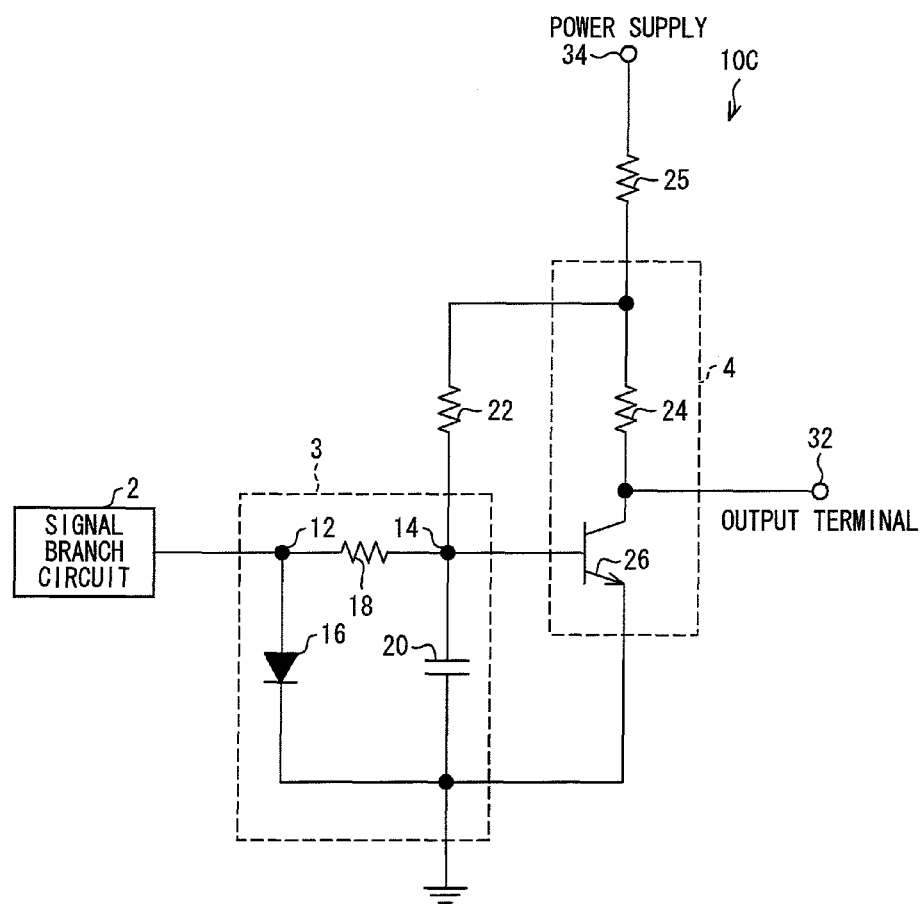
FIG. 6 is a circuit diagram showing a fourth example configuration of the wave detector circuit of FIG. 1.

Next, a fourth example configuration of the wave detector circuit 10 is described with reference to FIG. 6. FIG. 6 is a circuit diagram showing a fourth example configuration of the wave detector circuit 10 (wave detector circuit 10C).

The wave detector circuit 10C of FIG. 6 is obtained by adding a voltage-adjusting resistor 25 to such a wave detector circuit 10 as shown in FIG. 3. The diode detector circuit 3 and the amplifier circuit 4 are identical in configuration as those shown in FIG. 3.

The voltage-adjusting resistor 25, connected in series to the bias resistor 18 and the load resistor 24, contributes to the same temperature compensating effect as these resistors. By appropriately setting the temperature coefficients of these three resistors, a detection characteristic can be obtained whose temperature dependence has been suppressed well over an output power range of which the wave detection circuit 10C is required.

The wave detector circuit according to the present invention is preferably configured such that at least either the bias resistor or the load resistor is constituted by a resistive element having a temperature coefficient of 500 ppm/° C. or higher.

The foregoing configuration brings about a further effect of making it possible to more surely control the temperature dependence of the detected output.

The wave detector circuit according to the present invention is preferably configured such that: the diode and the transistor are constituted by a common npn structure composed of an emitter layer, a base layer, and a collector layer; and at least either the bias resistor or the load resistor is constituted by a base-layer resistor formed on the base layer or a collector-layer resistor formed on the collector layer.

The foregoing configuration brings about a further effect of making it possible to more surely control the temperature dependence of the detected output without having to add any special process.

It should be noted that the diode detector circuit can be configured to include (i) a diode having its anode terminal connected to an input point and its cathode terminal grounded, (ii) a bias resistor having one terminal connected to the input point and the other terminal connected to an output point, and (iii) a capacitor having one terminal connected to the output point and the other terminal grounded, and to output via the output point a direct-current voltage corresponding to a strength of an alternating-current signal that is inputted via the input point, the diode being connected to a power supply via the bias resistor.

Further, the diode detector circuit can be configured to include (i) a diode having its cathode terminal connected to an input point and its anode terminal connected to an output point via a bias resistor, (ii) an inductor having one terminal connected to the input point and the other terminal grounded, (iii) a resistor having one terminal connected to the output point and the other terminal grounded, and (iv) a capacitor having one terminal connected to the output point and the other terminal grounded, and to output via the output point a direct-current voltage corresponding to a strength of an alternating-current signal that is inputted via the input point, the diode being connected to a power supply via the bias resistor.

Further, the transistor amplifier circuit can be configured to include (i) a first bipolar transistor having its collector terminal connected to a power supply via a first load resistor, its base terminal connected to an output point of the diode detector circuit, and its emitter terminal grounded and (ii) a second bipolar transistor, having its collector terminal connected to the power supply via a second load resistor and its base terminal connected to the collector terminal of the first bipolar transistor, which outputs an output voltage via its emitter terminal.

A high-frequency circuit including such a wave detector circuit is also included within the scope of the present invention. As with the wave detector circuit, the high-frequency circuit brings about an effect of making it possible to control the temperature dependence of a detected output more easily and more efficiently than ever before.

(Note)

The present invention is not limited to the description of the embodiments above, but may be altered by a skilled person within the scope of the claims. An embodiment based on a proper combination of technical means disclosed in different embodiments is encompassed in the technical scope of the present invention.

INDUSTRIAL APPLICABILITY

A wave detector circuit of the present invention can be widely applied for high-frequency circuits. For example, the wave detector circuit of the present invention can be suitably used as a transmitter power amplifier that is mounted in a wireless communication device.

REFERENCE SIGNS LIST

1 Main high-frequency circuit
2 Signal branch circuit
3, 3B Diode detector circuit
4, 4A Amplifier circuit (transistor amplifier circuit)
5 Bias resistor
6 Load resistor
10, 10A, 10B, 10C Wave detector circuit
12 Input point
14 Output point
15 Inductor
16 Wave detector diode
18 Bias resistor
20 Capacitor
24 Load resistor
26 Bipolar transistor (first bipolar transistor)
28 Bipolar transistor (second bipolar transistor)
34 Power supply
40 SI substrate
41 Sub-collector layer
42 Collector layer
43 Base layer
44 Base electrode
45 Emitter layer
46 Coupling electrode
47 Emitter electrode
48 Collector electrode
49 Insulator
50 Base contact electrode
51 Collector contact electrode
52 Emitter contact electrode
100 High-frequency circuit

The invention claimed is:

1. A wave detector circuit comprising:
a diode detector circuit, including a diode connected to a power supply via a bias resistor, which uses the diode to generate a direct-current voltage corresponding to a strength of an alternating-current signal; and
a transistor amplifier circuit, including a transistor connected to a power supply via a load resistor, which uses the transistor to amplify the direct-current voltage generated by the diode detector circuit,
a sum of an amount of change in output voltage of the transistor amplifier circuit along with a change in temperature of the bias resistor and an amount of change in output voltage of the transistor amplifier circuit along with a change in temperature of the load resistor having a temperature range equal to or larger than an amount of change in output voltage of the transistor amplifier circuit along with a change in temperature of the diode.

2. The wave detector circuit as set forth in claim 1, wherein at least either the bias resistor or the load resistor is constituted by a resistive element having a temperature coefficient of 500 ppm/° C. or higher.

3. The wave detector circuit as set forth in claim 1, wherein:
the diode and the transistor are constituted by a common npn structure composed of an emitter layer, a base layer, and a collector layer; and
at least either the bias resistor or the load resistor is constituted by a base-layer resistor formed on the base layer or a collector-layer resistor formed on the collector layer.

4. The wave detector circuit as set forth in claim 1, wherein the diode detector circuit includes (i) a diode having its anode terminal connected to an input point and its cathode terminal grounded, (ii) a bias resistor having one terminal connected to the input point and the other terminal connected to an output point, and (iii) a capacitor having one terminal connected to the output point and the other terminal grounded, and outputs via the output point a direct-current voltage corresponding to a strength of an alternating-current signal that is inputted via the input point, the diode being connected to a power supply via the bias resistor.

5. The wave detector circuit as set forth in claim 1, wherein the diode detector circuit includes (i) a diode having its cathode terminal connected to an input point and its anode terminal connected to an output point via a bias resistor, (ii) an inductor having one terminal connected to the input point and the other terminal grounded, and (iii) a resistor having one terminal connected to the output point and the other terminal grounded, and (iv) a capacitor having one terminal connected to the output point and the other terminal grounded, and outputs via the output point a direct-current voltage corresponding to a strength of an alternating-current signal that is inputted via the input point, the diode being connected to a power supply via the bias resistor.

6. The wave detector circuit as set forth in claim 1, wherein the transistor amplifier circuit includes (i) a first bipolar transistor having its collector terminal connected to a power supply via a first load resistor, its base terminal connected to an output point of the diode detector circuit, and its emitter terminal grounded and (ii) a second bipolar transistor, having its collector terminal connected to the power supply via a second load resistor and its base terminal connected to the collector terminal of the first bipolar transistor, which outputs an output voltage via its emitter terminal.

7. A high-frequency circuit comprising a wave detector circuit as set forth in claim 1.

8. The high-frequency circuit as set forth in claim 7, further comprising:
   a driver stage for amplifying a high-frequency signal; and
   a power stage for further amplifying the high-frequency signal amplified by the driver stage,
   said high-frequency circuit using the wave detector circuit to generate a direct-current voltage corresponding to a strength of the high-frequency signal amplified by the driver stage.

9. The high-frequency circuit as set forth in claim 8, further comprising a capacitor inserted between the driver stage and the wave detector circuit.

* * * * *